United States Patent [19]

Douglas

[11] Patent Number: 4,711,698
[45] Date of Patent: Dec. 8, 1987

[54] SILICON OXIDE THIN FILM ETCHING PROCESS

[75] Inventor: Monte A. Douglas, Dallas, Tex.

[73] Assignee: Texas Instruments Incorporated, Dallas, Tex.

[21] Appl. No.: 755,140

[22] Filed: Jul. 15, 1985

[51] Int. Cl.[4] .................. B44C 1/22; C03C 15/00; C03C 25/06; C23F 1/02

[52] U.S. Cl. .................. 156/643; 156/646; 156/653; 156/655; 156/657; 156/659.1; 156/667; 204/192.32; 252/79.1

[58] Field of Search ............... 156/643, 644, 646, 653, 156/655, 657, 659.1, 662, 667; 204/192 EC, 192 E; 427/38, 39; 252/79.1

[56] References Cited

U.S. PATENT DOCUMENTS

| 3,095,341 | 6/1963 | Ligenza | 156/662 X |
| 4,350,729 | 9/1982 | Nakano et al. | 156/667 X |
| 4,465,552 | 8/1984 | Bobbio et al. | 156/643 |
| 4,544,444 | 10/1985 | Chang | 156/646 X |

OTHER PUBLICATIONS

Pang et al., "Damage Induced in Si by Ion Milling or Reactive Ion Etching", *J. Appl. Phys.*, 54 (6) Jun. 1983, pp. 3272-3277.

Winters, "The Role of Chemisorption in Plasma Etching", *J. Appl. Phys.*, 49 (10), Oct. 1978, pp. 5165-5170.

Coburn et al., "Ion-Surface Interactions in Plasma Etching", *J. Appl. Phys.*, vol. 48, No. 8, Aug. 1977, pp. 3532-3540.

Heinecke, "Control of Relative Etch Rates of $SiO_2$ and Si in Plasma Etching", *Solid State Electronics*, 1975, pp. 1146-1147.

Heinecke, "Plasma Etching of Films at High Rates", *Solid State Technology*, Apr. 1978, pp. 104-106.

Whitcomb, "Selective, Anisotropic Etching of $SiO_2$ and PSG in $CHF_3/SF_6$, RIE Plasma", *Conference; Electrochemical Society Incorporated*, Spring Meeting, 5/9-14/1982, pp. 339-340.

*Primary Examiner*—William A. Powell
*Attorney, Agent, or Firm*—Leo N. Heiting; Melvin Sharp

[57] ABSTRACT

A plasma dry etch process for etching semiconductor insulating materials, such as thermally grown or CVD deposited silicon oxide, with selectivity to silicon and refractory metals and their silicides, using a fluorinated inorganic center together with a hydrogen-liberating source under glow discharge conditions. The process does not employ saturated or unsaturated fluorocarbons as etchants, thereby eliminating the polymerization problem.

25 Claims, 2 Drawing Figures

SILICON OXIDE THIN FILM ETCHING PROCESS

BACKGROUND AND SUMMARY OF THE INVENTION

The present invention relates to methods for fabricating integrated circuits.

In integrated circuit fabrication generally, etching of silicon oxides is one of the most frequently required process steps. Not only stoichiometric silicon dioxide, but also other silicon oxides which are slightly or greatly non-stoichiometric and/or which contain substantial fractions of other elements (e.g. silicate glasses such as phosphosilicate glass or germanophosphosilicate glass or borophosphosilicate glass) present rather similar etching problems.

Conventional glow discharge processes used to etch silicon oxide thin films (e.g. to create contact vias in integrated circuit fabrication) employ saturated or unsaturated fluorocarbons as the primary active constituents. For instance, $CF_4$, $CHF_3$, and $C_3F_8$ have all been successfully employed as active etchant gases to etch $SiO_2$ with selectivity to a Si substrate. Electron-impact-induced fragmentation and photodissociation of the fluorinated hydrocarbon generate very reactive atomic fluorine and molecular $C_xF_y$ radicals as well as various ionized species.

Unfortunately, the $C_xF_y$ molecular radicals readily combine as monomeric units to form polymeric substances in the reactor and, under certain conditions, on the etch substrate as well. Polymerization is particularly facile when the fluorine:carbon ratio of the predominate, fragmented radical is in the vicinity of 2:1, where optimal $SiO_2$:Si selectively is typically observed. Unless polymerization is carefully controlled, deposition on the etched substrate will constitute a source of device defects and is likely to contribute to high contact resistance for oxide etched contact vias. Moreover, deposition on the reactor chamber constitutes an inherent source of particulates, and it becomes more important to eliminate this particulate source as clean room technology achieves reductions in the particulate levels contributed by other sources. Additionally, a study has reported that plasma etch processes which employ fluorocarbons, such as $CF_4$, induce more damage in silicon of the nature of increased interface states and reduced carrier lifetime than processes using other gases: See Pang et al., 54 J. Appl. Phys. 3272 (1983), which is hereby incorporated by reference. This problem can be greatly aggravated in oxide etches which stop on refractory metals or refractory metal silicides: many of these metallic elements tend to catalyze polymer formation, so that polymerization can become truly disastrous during the normal overetch period, and even worse when substantial amounts of overetch are required, such as when a contact etch is being performed through a planarized interlevel oxide.

Consequently, it is of significant interest to develop alternative oxide plasma etch processes that are not prone to problems associated with polymerization and possibly silicon damage.

Silicon oxide etching with fluorocarbon-based chemistries has been widely studied under various glow discharge conditions, and several generally applicable observations have been made. Heinecke (see Heinecke, 18 Solid State Electronics 1146 (1975), and Heinecke, 21 Solid State Technology 104 (1978), which are hereby incorporated by reference) was the first to note that fluorine-deficient discharges provide higher $SiO_2/Si$ etch rate ratios relative to $CF_4$ plasmas; this selectivity is critical to semiconductor $SiO_2$ etch processing, since doped polysilicon is often the etch stop substrate. Many studies since have reported good $SiO_2$:Si etch rate ratios utilizing fluorine-deficient plasmas, generating fluorine deficiency by various means including (a) addition of $H_2$, which inhibits atomic fluorine reactivity by forming HF, (b) utilization of fluorocarbons having stoichiometric low fluorine-to-carbon ratios such as $C_2F_6$ and $C_3F_8$, and (c) employment of electrodes such as carbon, silicon, or teflon which react with and hence consume atomic fluorine. A widely accepted model which rationalizes the etch behavior observed with fluorine-deficient plasmas suggests that carbon is continually impinging upon the etch surface in the form of neutral and ionized $C_xF_y$ radicals which fragment on impact or dissociatively chemisorb to effectively "poison" Si but not $SiO_2$ surfaces with respect to significant etching. See Winters, 49 J. Appl. Phys. 5165 (1978), and Coburn, Winters, and Chuang, 48 J. Appl. Phys. 3532 (1977), which are hereby incorporated by reference. Si etching is inhibited because atomic fluorine, which readily reacts with and volatilizes Si in the form of $SiF_x$, is consumed by the carbon surface coverage to volatilize carbon in the form of $CF_x$. In contrast, carbon on a $SiO_2$ surface can be volatilized without consuming atomic fluorine by reacting with the lattice oxygen in the oxide to form CO, $CO_2$, and $COF_2$. Also, several studies have suggested that $C_xF_y$ radicals, such as $CF_3$, may play an important role as active etchants of $SiO_2$ but not Si, which would further increase the etching difference between $SiO_2$ and Si. Consequently, gasification of silicon relative to its oxide will be more sensitive to a fluorine-deficient plasma, thereby permitting establishment of etch processes with high $SiO_2$:Si etch rate ratios.

The present invention teaches novel processes for etching oxides selectively by using a fluorinated inorganic center plus hydrogen as the feed gas mixture for a glow discharge. In particular, plasma etch processes involving etchant mixtures of hydrogen (or a hydrogen-liberating species) with gases such as $NF_3$, $BF_3$, $SiF_4$, and $SF_6$ may exhibit good $SiO_2$:Si selective etch rate ratios. There has been virtually no effort directed toward studying these chemical systems, except for a study of $SF_6/H_2$ which did not show etch trends consistent with the present invention. See Toyoda, Tobinaga, and Komiya, 20 Jpn. J. Appl. Phys. 681 (1981), which is hereby incorporated by reference.

The present invention provides viable oxide etch processes not prone to polymerization or possibly to Si damage. Since many materials, including most metals, are readily gasified by reactive fluorine, selectivity to nonoxide etch stop substrates may be readily achievable. This is particularly important in view of multilevel metalization schemes where the oxide etch is required to stop on metal, upon which polymerization may be more pronounced for a fluorocarbon-based etch.

According to the present invention there is provided:

A method for selectively etching silicon oxides, comprising the steps of:

providing a substrate having thereon a thin film of silicon oxides which must be selectively etched with respect to another thin film layer on said substrate;

creating a glow discharge in proximity to said substrate; and passing an etchant gas mixture through said glow discharge, said etchant gas mixture comprising both an inorganic fluorine-liberating source gas and a hydrogen-liberating source gas.

According to a further embodiment of the present invention there is provided:

A method for selectively etching silicon oxides, comprising the steps of:

providing a substrate having thereon a thin film of silicon oxides which must be selectively etched with respect to another thin film layer on said substrate;

creating a glow discharge in proximity to said substrate; and passing an etchant gas mixture through said glow discharge, wherein the atomic percentage of carbon in said etchant gas mixture is less than 5% atomic;

and wherein the atomic ratio of fluorine to carbon in said etchant gas mixture is substantially greater than 2:1;

and wherein the percentage in said etchant gas mixture of all atomic species which form (in a glow discharge) molecules and radicals capable of absorbing onto and reducing silicon oxides is in the range of 5% atomic to 50% atomic of said etchant gas mixture;

all of said atomic percentages being counted over all the component species of said etchant gas mixture which contain hydrogen, carbon, or fluorine, but disregarding inert gas components.

According to a further embodiment of the present invention there is provided:

A method for selectively etching metal oxides, comprising the steps of:

providing a substrate having thereon a thin film of oxides which must be selectively etched with respect to another thin film layer on said substrate;

creating a glow discharge in proximity to said substrate; and passing an etchant gas mixture through said glow discharge, wherein the atomic percentage of carbon in said etchant gas mixture is less than 5% atomic;

and wherein the atomic ratio of fluorine to carbon in said etchant gas mixture is substantially greater than 2:1;

and wherein the percentage in said etchant gas mixture of all atomic species which form (in a glow discharge) molecules and radicals capable of adsorbing onto and reducing said metal oxides is in the range of 5% atomic to 50% atomic of said etchant gas mixture;

all of said atomic percentages being counted over all the component species of said etchant gas mixture which contain hydrogen, carbon, or fluorine, but disregarding inert gas components.

BRIEF DESCRIPTION OF THE DRAWINGS

The present invention will be described with reference to the accompanying drawings, wherein.

Figure 1:
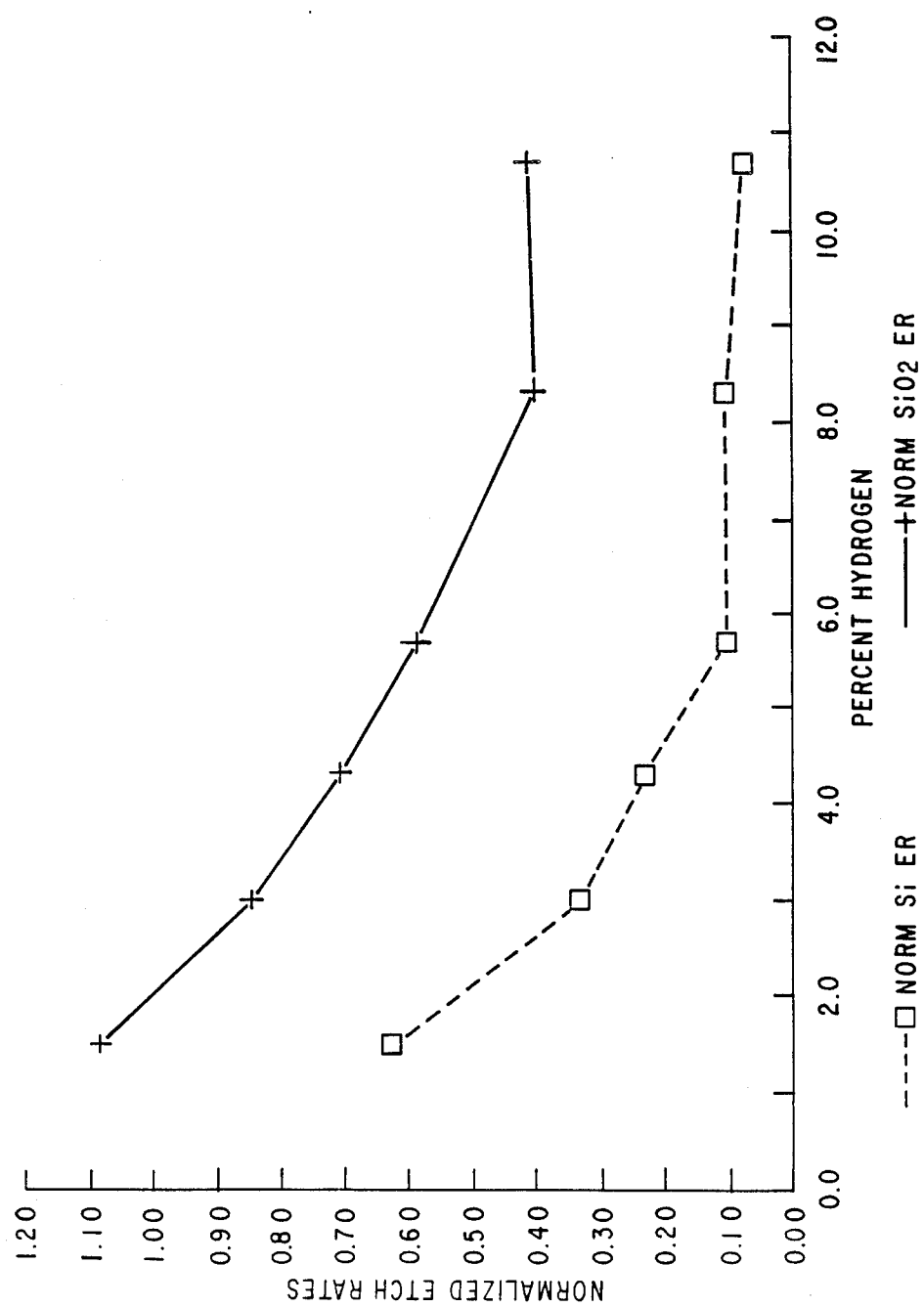
FIG. 1 shows the dependence of normalized etch rate on hydrogen concentration for various embodiments of the invention.

According to a further embodiment of the present invention there is provided a method for selectively etching metal oxides selected from the group consisting of tantalum oxides, aluminum oxides, yttrium oxides, zirconium oxides, and titanium oxides. comprising the steps of: providing a substrate having thereon a thin film of oxides which must be selectively etched with respect to another thin film layer on said substrate, said oxides being selected from the group consisting of tantalum oxides, aluminum oxides, yttrium oxides, zirconium oxides, and titanium oxides; creating a glow discharge in proximity to said substrate; and passing an etchant gas mixture through said glow discharge, wherein the atomic percentage of carbon in said etchant gas mixture is less than 5% atomic; and wherein the atomic ratio of fluorine to carbon in said etchant gas mixture is substantially greater than 2:1; and wherein the percentage in said etchant gas mixture of all atomic species which form (in a glow discharge) molecules and radicals capable of adsorbing onto and reducing said metal oxides is in the range of 5% atomic to 50% atomic of said etchant gas mixture; all of said atomic percentages being counted over all the component species of said etchant gas mixture which contain hydrogen, carbon, or fluorine, but disregarding inert gas components.

DESCRIPTION OF THE PREFERRED EMBODIMENTS

In sample embodiments of the invention as presently practiced, BF$_3$/H$_2$/Ar gas mixtures have been used to evaluate the SiO$_2$-to-Si etch rate ratio as a function of the percent hydrogen in the total gas flow (BF$_3$+H$_2$ flow). Since the source of H$_2$ was a mixture of Ar with 3% hydrogen, normalized Si and SiO$_2$ etch rates were calculated by dividing the material etch rate with a BF$_3$/H$_2$/Ar mixture by the etch rate for a BF$_3$/Ar mixture where the total flow is identical for each evaluation. This was necessary to distinguish the influence of increased Ar gas flow on the observed results from the effect of increased percent hydrogen. The experiments were conducted in a single-slice, RIE research reactor maintained at 15 degrees C and 500 millitorr, having a 150 watt RF discharge across the ambient. The BF$_3$ flow was kept constant at 50 sccm. Table 1 shows the raw data for Si and SiO$_2$ etch rates and etch rate ratios as a function of argon and argon/3% H$_2$ flow.

TABLE I

| [sccm] | Si ETCH RATE [A/min] | SiO$_2$ ETCH RATE [A/min] | SiO$_2$/ Si ERR |
|---|---|---|---|
| Ar FLOW | | | |
| 25.000 | 115.000 | 105.000 | 0.913 |
| 50.000 | 111.000 | 115.000 | 1.036 |
| 75.000 | 126.000 | 131.000 | 1.040 |
| 100.000 | 126.000 | 148.000 | 1.175 |
| 150.000 | 105.000 | 149.000 | 1.419 |
| 200.000 | 95.000 | 142.000 | 1.49 |
| Ar/3% H$_2$ FLOW | | | |
| 25.000 | 72.000 | 114.000 | 1.583 |
| 50.000 | 37.000 | 97.000 | 2.622 |
| 75.000 | 29.000 | 92.000 | 3.172 |
| 100.000 | 13.000 | 87.000 | 6.692 |
| 150.000 | 11.000 | 60.000 | 5.455 |
| 200.000 | 9.700 | 58.300 | 6.010 |

Table II shows the normalized Si and SiO$_2$ etch rates and etch rate ratios as a function of percent H$_2$.

TABLE II

| H$_2$ % [H$_2$ Flow] [BF$_3$ + H$_2$] | Si ER Si [Ar + H$_2$] ER Si[Ar] ER | SiO$_2$ ER SiO$_2$ [Ar + H$_2$] ER SiO$_2$ [Ar] ER | NORM ER RATIO NORM SiO$_2$ ER NORM Si ER |
|---|---|---|---|
| 1.500 | 0.626 | 1.086 | 1.734 |
| 3.000 | 0.333 | 0.843 | 2.530 |
| 4.300 | 0.230 | 0.702 | 3.051 |
| 5.700 | 0.103 | 0.588 | 5.698 |

TABLE II-continued

| H₂ % [H₂ Flow] [BF₃ + H₂] | Si ER Si [Ar + H₂] ER Si[Ar] ER | SiO₂ ER SiO₂ [Ar + H₂] ER SiO₂ [Ar] ER | NORM ER RATIO NORM SiO₂ ER NORM Si ER |
|---|---|---|---|
| 8.300 | 0.105 | 0.403 | 3.844 |
| 10.700 | 0.102 | 0.411 | 4.03 |

Figure 2:
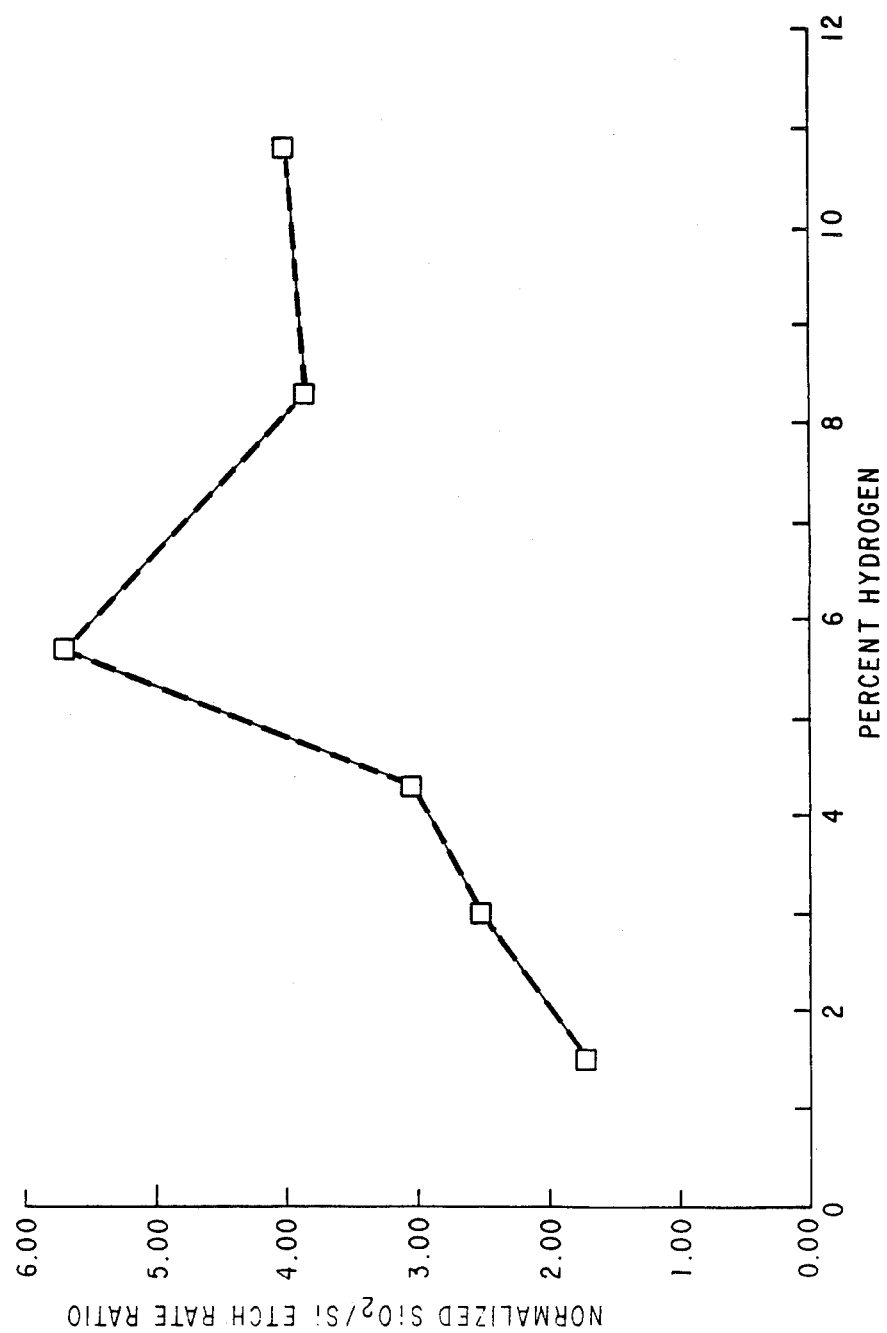
FIG. 2 shows the dependence of Si:SiO$_2$ selectivity on H$_2$ concentration.

FIG. 1 shows a plot of the data from Table II. FIG. 1 shows that the etch rate for Si decreases faster than the $SiO_2$ etch rate as the percent $H_2$ is increased, i.e. the $SiO_2$-to-Si etch rate ratio increases with increased hydrogen flows. FIG. 2 shows that the etch rate ratio maximizes at about 5 percent $H_2$, decreasing for higher hydrogen percentages. The maximum etch rate ratio (selectivity) achieved in these sample embodiments is of the same magnitude observed for conventional high pressure oxide etching with fluorocarbons.

In attaining optimal selectivity with other inorganic fluorine-liberating source gasses or other hydrogen-liberating source gasses, the preferred atomic ratio of fluorine to hydrogen is in the range between 15 to one and 30:1. However, other gas mixtures which do not fall within this range may also be within the scope of the invention, although they may be less preferred. One whole class of alternative preferred embodiments uses $SF_6$ (or a comparably copious fluorine-liberating source) as the fluorine-liberating source gas, and in this class of embodiments, the the preferred atomic ratio of fluorine to hydrogen is in the range between 10:1 and 20:1.

The presently preferred best mode of the invention uses boron trifluoride as the gaseous inorganic fluorine-liberating source species, but others can be used instead. The most preferred species are $NF_3$, $SF_6$, $SiF_4$, and $BF_3$, in that order of preference, but other inorganic fluorides can be used instead. $NF_3$ and $SF_6$ are the most preferred fluorides because they easily liberate a gaseous oxide upon reduction of $SiO_2$. Under the high impingement conditions of plasma etching, it would be somewhat misleading to try to define precisely which species are or are not volatile; but comparison is easier here than absolute definition, and $NF_3$ and $SF_6$ are both expected to be more preferred than $BF_3$ because the products of their reaction with $SiO_2$ are more volatile than those of boron.

The inorganic fluorine-liberating source gas need not be strictly a perfluoro compound, although perfluoro compounds are the most convenient species.

However, it is essential that the etchant gas mixture include a species which is capable of reducing the oxide being etched. Thus, for example, noble gas fluorides cannot be substituted as the fluorine-liberating source gas, unless some other component of the etchant gas mixture provides a sufficient quantity of a species which is capable of reducing the oxide being etched.

Similarly, the hydrogen-liberating source gas need not be $H_2$, but can be ammonia, borane, methane, or other hydrogen-liberating sources known to those skilled in the art.

Moreover, the fluorine-liberating source gas and the hydrogen-liberating source gas need not be exactly two distinct species, but may be combined in one species, or embodied as three or more species (optionally including one or more species which are both hydrogen donors and fluorine sources). In practising such embodiments, the key teaching of the present invention is that the atomic percentage of carbon, (counting atomic percentage over all the source gas component species which contain hydrogen, carbon, or fluorine, but disregarding inert gas components) must be less than 5% atomic. Moreover, the atomic ratio of fluorine to carbon should be substantially greater than 2:1, and may be much higher (or infinite).

A secondary teaching of the present invention is that the percentage of all atomic species (such as B, C, S, or N) which form (in a glow discharge) molecules and radicals capable of adsorbing onto and reducing silicon dioxide should be in the range of 5% atomic to 50% atomic of the etchant gas mixture (counting atomic percentage over all the source gas component species which contain hydrogen, carbon, or fluorine, but disregarding inert gas components). This teaching provides selective etching.

Of course, as is well known to those skilled in the art of plasma etching, inert gasses such as argon or helium may be added to the etchant gas mixture to provide better temperature control or for safer handling of explosive gasses such as hydrogen.

The present invention is aimed primarily at selective etching of silicon oxides, but may also be applied to etching other oxides, including species such as tantalum, aluminum, zirconium, and other metal oxides. In etching these oxides, the same problems of polymerization must be avoided, and (at least for some oxides) the same process of oxide reduction by absorbed molecules or radicals can be used to provide selective etching. In etching other oxides, the key teaching of the present invention is (1) that the atomic percentage of carbon, (counting atomic percentage over all the source gas component species which contain hydrogen, carbon, or fluorine, but disregarding inert gas components) must be less than 5% atomic. Moreover, (2) the atomic ratio of fluorine to carbon should be substantially greater than 2:1, and may be much higher (or infinite).

(3) A further teaching of the present invention is that the percentage of all atomic species (such as B, C, S, or N) which form (in a glow discharge) molecules and radicals capable of adsorbing onto and reducing the oxide being etched should be in the range of 5% atomic to 50% atomic of the etchant gas mixture (counting atomic percentage over all the source gas component species which contain hydrogen, carbon, or fluorine, but disregarding inert gas components). This teaching provides selective etching.

As will be apparent to those skilled in the art, the present invention can be widely modified and varied; the specific processing conditions given are merely illustrative, and the scope of the present invention is not limited except as specified in the allowed claims.

What is claimed is:

1. A method for selectively etching silicon oxides, comprising the steps of:
    providing a substrate having thereon a thin film of silicon oxides which must be selectively etched with respect to another thin film layer on said substrate;
    creating a glow discharge in proximity to said substrate; and
    passing an etchant gas mixture through said glow discharge, wherein the atomic percentage or carbon in said etchant gas mixture is less than 5% atomic;

and wherein the atomic ratio of fluorine to carbon in said etchant gas mixture is substantially greater than 2:1;

and wherein the percentage in said etchant gas mixture of all atomic species which form (in a glow discharge) molecules and radicals capable of adsorbing onto and reducing silicon oxides is in the range of 5% atomic to 50% atomic of said etchant gas mixture;

all of said atomic percentages being counted over all the component species of said etchant gas mixture which contain hydrogen, carbon, or fluorine, but disregarding inert gas components.

2. The method of claim 1, wherein said etchant gas mixture has a pressure in the range of 100 milliTorr to 3 Torr.

3. The method of claim 1, wherein said etchant gas mixture comprises an inorganic fluorine-liberating source gas selected from the group consisting of nitrogen trifluoride, sulfur hexafluoride, silicon tetrafluoride, and boron trifluoride.

4. The method of claim 1, wherein said silicon oxide comprises a planarized layer over a nonplanarized substrate, said planarized oxide layer having variable thickness over said substrate, and wherein said step of creating a glow discharge in proximity to said substrate is continued for a sufficiently long time to etch through the thickest portion of said planarized oxide layer to said substrate.

5. The method of claim 1, wherein said other thin film layer is a metal silicide.

6. The method of claim 1, wherein at least a portion of said other thin layer film includes at least 10% atomic of a refractory metal.

7. The method of claim 1, wherein said thin film of silicon oxides comprises phosphosilicate glass.

8. The method of claim 1, wherein said thin film of silicon oxides comprises a doped silicate glass.

9. The method of claim 1, wherein said etchant gas mixture comprises a hydrogen-liberating source gas which comprises $H_2$.

10. The method of claim 1, wherein said etchant gas mixture comprises a hydrogen-liberating source gas which consists essentially of ammonia.

11. The method of claim 1, wherein said etchant gas mixture comprises a hydrogen-liberating source gas which is selected from the group consisting of singly and doubly halogenated methane compounds.

12. The method of claim 1, wherein said other thin film layer comprises silicon.

13. The method of claim 1, wherein said other thin film layer is polycrystalline.

14. The method of claim 1, wherein said etchant gas mixture further comprises an inert gas.

15. The method of claim 1, wherein said etchant gas mixture has an atomic ratio of fluorine to hydrogen in the range between 15:1 and 30:1.

16. The method of claim 1, wherein said thin film of silicon oxides has an atomic ratio of silicon to oxygen in the range between 1:1.7 and 1:1.98 inclusive.

17. The method of claim 1, wherein said etchant gas mixture contains at least one inorganic species which is both a fluorine-liberating source gas and a hydrogen-liberating source gas.

18. The method of claim 1, wherein etchant gas mixture includes at least three distinct species which are either fluorine-liberating or hydrogen-liberating or both.

19. The method of claim 1, wherein the atomic percentage of carbon in said etchant gas mixture (counting atomic percentage over all the component species of said etchant gas mixture which contain hydrogen, carbon, or fluorine, but disregarding inert gas components) is less than 5% atomic.

20. The method of claim 1, wherein the atomic ratio of fluorine to carbon in said etchant gas mixture is substantially greater than 2:1.

21. The method of claim 1, wherein the percentage in said etchant gas mixture of all atomic species which form (in a glow discharge) molecules and radicals capable of adsorbing onto and reducing silicon oxides is in the range of 5% atomic to 50% atomic of the etchant gas mixture (counting atomic percentage over all the etchant gas component species which contain hydrogen, carbon, or fluorine, but disregarding inert gas components).

22. The method for selectively etching metal oxides, comprising the steps of:

providing a substrate having thereon a thin film of metal oxides which must be selectively etched with respect to another thin film layer on said substrate;

creating a glow discharge in proximity to said substrate; and passing an etchant gas mixture through said glow discharge, said etchant gas mixture comprising both an inorganic fluorine-liberating source gas and a hydrogen-liberating source gas.

23. A method for selectively etching metal oxides, comprising the steps of:

providing a substrate having thereon a thin film of oxides which must be selectively etched with respect to another thin film layer on said substrate;

creating a glow discharge in proximity to said substrate; and passing an etchant gas mixture through said glow discharge, wherein the atomic percentage of carbon in said etchant gas mixture is less than 5% atomic;

and wherein the atomic ratio of fluorine to carbon in said etchant gas mixture is substantially greater than 2:1;

and wherein the percentage in said etchant gas mixture of all atomic species which form (in a glow discharge) molecules and radicals capable of adsorbing onto and reducing said metal oxides is in the range of 5% atomic to 50% atomic of said etchant gas mixture;

all of said atomic percentages being counted over all the component species of said etchant gas mixture which contain hydrogen, carbon, or fluorine, but disregarding inert gas components.

24. The method of claim 22, wherein said metal oxides are selected from the group consisting of tantalum oxides, aluminum oxides, yttrium oxides, zirconium oxides, and titanium oxides.

25. The method of claim 23, wherein said metal oxides are selected from the group consisting of tantalum oxides, aluminum oxides, yttrium oxides, zirconium oxides, and titanium oxides.

* * * * *